(12) United States Patent
Sakamoto et al.

(10) Patent No.: US 7,786,453 B2
(45) Date of Patent: Aug. 31, 2010

(54) CHARGED-PARTICLE BEAM PATTERN WRITING METHOD AND APPARATUS WITH A PIPELINE PROCESS TO TRANSFER DATA

(75) Inventors: Shinji Sakamoto, Kanagawa (JP); Shigehiro Hara, Kanagawa (JP); Hitoshi Higurashi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 369 days.

(21) Appl. No.: 11/782,209

(22) Filed: Jul. 24, 2007

(65) Prior Publication Data

US 2008/0023655 A1    Jan. 31, 2008

(30) Foreign Application Priority Data

Jul. 26, 2006  (JP) .............................. 2006-203093

(51) Int. Cl.
    *G21K 5/00*    (2006.01)
    *G06F 5/10*    (2006.01)
(52) U.S. Cl. .............................. 250/492.22; 250/492.2; 250/492.3; 710/33
(58) Field of Classification Search ...................... 430/5, 430/22, 30, 296, 311; 702/28, 31, 40, 35, 702/36, 38, 32, 33; 250/492.1, 492.2, 492.21, 250/492.22, 492.23, 492.3, 491.1; 710/1, 710/22, 29, 31, 33
See application file for complete search history.

(56) References Cited

U.S. PATENT DOCUMENTS 3,916,187 A * 10/1975 Fletcher et al. ............. 250/251
4,280,186 A * 7/1981 Hidai et al. ................. 345/441
4,951,216 A * 8/1990 Maluo .......................... 716/21
6,064,807 A * 5/2000 Arai et al. ..................... 430/30
6,541,784 B1 * 4/2003 Kawano et al. .......... 250/492.3
6,580,075 B2 * 6/2003 Kametani et al. ........... 250/310
2003/0146397 A1 * 8/2003 Yoda et al. ............. 250/492.22
2003/0224266 A1 * 12/2003 Akagawa et al. ............ 430/30
2005/0285054 A1 * 12/2005 Inoue et al. ............ 250/492.22
2006/0151721 A1 * 7/2006 Nakasugi et al. ....... 250/492.22
2006/0289805 A1 * 12/2006 Nakasugi et al. ....... 250/492.23
2008/0121804 A1 * 5/2008 Nakasuji et al. ............ 250/310

FOREIGN PATENT DOCUMENTS

JP          5-90141       4/1993
JP       2005-293333     10/2005

* cited by examiner

*Primary Examiner*—Jack I Berman
*Assistant Examiner*—Nicole Ippolito Rausch
(74) *Attorney, Agent, or Firm*—Oblon, Spivak, McClelland, Maier & Neustadt, L.L.P.

(57) ABSTRACT

A charged-particle beam writing apparatus includes first and second storage devices, a transfer processor for sequentially sending to the first storage several design data files per pattern layout-defined region, a first data processor which sequentially reads design data files from the first storage and converts each data file's design data into draw data for storage in the second storage while being pipelined with the transfer processing, second to n-th data processors which sequentially read data files from the second storage and apply mutually different ones of second to n-th data processings to each draw data in a way that the first to n-th data processings are pipelined and store the processed draw data in the second storage, and a pattern-writing unit for writing a pattern on a workpiece by using a beam that is controlled based on each n-th data processing-completed data being stored in the second storage.

10 Claims, 9 Drawing Sheets

Related Art

CHARGED-PARTICLE BEAM PATTERN WRITING METHOD AND APPARATUS WITH A PIPELINE PROCESS TO TRANSFER DATA

CROSS-REFERENCE TO RELATED APPLICATION

This application is based upon and claims the benefit of priority from prior Japanese Patent Application No. 2006-203093 filed on Jul. 26, 2006 in Japan, the entire contents of which are incorporated herein by reference.

BACKGROUND OF THE INVENTION

1. Field of the Invention

The present invention relates generally to charged-particle beam lithography technologies and, more particularly, to a technique for converting pattern layout-defined design data to thereby create data for use in electron beam lithographic apparatus. This invention also relates to a pattern writing method and apparatus using the data conversion technique.

2. Related Art

Lithography that plays a role for advance in miniaturization of semiconductor devices is a very important process among semiconductor fabrication processes in light of its pattern generation feature unique thereto. In recent years, an increase in integration density of LSI chips results in a year by year decrease in circuit line width required for semiconductor devices. In order to form a desired circuit pattern on substrates of these semiconductor devices, a high-precision original image pattern (also known as a reticle or a mask) is required. Note here that electron ray (electron beam) pattern writing techniques have inherently excellent resolution properties and, for this reason, are used for the manufacture of such high-precision original patterns.

FIG. 10 is a conceptual diagram for explanation of an operation of one prior known electron beam pattern writing apparatus.

A variable-shaped electron beam (EB) pattern writing apparatus operates as follows. In a first aperture 410, a rectangular opening 411 is formed for shaping an electron beam 330. In a second aperture 420, a variable shaping opening 421 is formed for reshaping the electron beam 330 that has passed through the opening 411 into a desired rectangular shape. The electron beam 330 that was emitted from a charged particle source 430 and then passed through the opening 411 is deflected by a deflector. Then, it passes through part of the variable shaping opening 421 to be irradiated onto a workpiece 340, which is mounted on a stage. This stage is driven to continuously move in a prespecified one direction (e.g., X direction). More specifically, a rectangular beam shape that can penetrate both the opening 411 and the variable shaping opening 421 is drawn or written on the workpiece 340 in a pattern writing area thereof. The scheme for causing the beam to pass through both the opening 411 and the variable shaping opening 421 to form a desired shape is called the variable-shaped beam (VSB) technique.

When performing the electron beam pattern writing, what is done first is to design a semiconductor integrated circuit layout, thereby to generate layout data (design data) with a pattern layout defined therein. Then, in the prior art, the layout data is converted by an external device to thereby generate draw data capable of being input to the electron beam pattern writing apparatus. The draw data are transferred in unison to the writing apparatus all at once for input to the electron beam pattern writing apparatus so that pattern writing is performed based on the draw data in the pattern writing apparatus after having converted through a plurality of conversion processes into the format of such apparatus.

However, with growth in the quest for higher integration of LSIs, the electron beam pattern writing apparatus becomes huge in amount of data to be processed thereby. This poses a problem as to unwanted increases in time required to generate the draw data by the external device that becomes off-lined with the electron beam pattern writing apparatus and also in time taken to complete all-at-once transmission of the generated draw data to the electron beam pattern writing apparatus, resulting in an overall pattern writing time being appreciably increased. Simultaneously, this also causes unwanted increase in manufacturing costs of masks under pattern write processing.

Here, some teachings are disclosed as to the external device that becomes offlined, although not for the electron beam pattern writing apparatus per se. The external device (i.e., draw data creation device) is arranged to have a parallel combination of more than two arithmetic processing units for preparation of the draw data, which units are different from each other in stage number of series-connected processors. With such arrangement, it is asserted that even load significance-different design data is convertable into draw data by use of a pipeline configuration as suggested, for example, in JP-A-5-90141. Additionally, JP-A-2005-293333 discloses therein a technique for causing a host computer to transfer control contents to a device controller while letting the contents be divided into functions that are processable within a given length of time period, and for permitting the device controller to control a field device based on the functions in real time, although this technique is not specifically relevant to the electron beam lithography technology.

As has been described above, with a noticeable increase in data amount, prior art approaches are faced with a problem as to increases in the time needed for generation of draw data at the offlined external device and in the time taken for transmission in unison all at once of the generated draw data to the electron beam pattern writing apparatus, resulting in an unwanted increase in pattern writing time.

BRIEF SUMMARY OF THE INVENTION

It is therefore an object of the present invention to provide a pattern writing apparatus and method capable of shortening a writing time period by performing efficiency-excellent data processing.

A charged particle beam writing apparatus includes first and second storage devices, a transfer processing unit operative to sequentially transfer to the first storage device a plurality of design data files per prespecified region having a pattern layout defined therein, a first data processor unit operative to sequentially read respective design data files from the first storage device and perform in a pipeline processing way with the transfer processing first data processing for converting design data within each data file into draw data of a predetermined format and then store the draw data processed in the second storage device, a set of second to n-th data processor units operative to sequentially read respective data files from the second storage device and perform mutually different ones of second to n-th data processing operations against each draw data in a way that the first to n-th data processing operations become a pipeline processing and then store the draw data processed into the second storage device, and a pattern writing unit operative to write a specified pattern on a workpiece by use of a charged particle beam which is controlled based on each data with the n-th data processing applied thereto, the each data being stored in the second storage device.

A charged particle beam pattern writing method includes the steps of sequentially transferring a plurality of design data files of each prespecified region having a pattern layout defined therein to a first storage device in a pattern writing apparatus to thereby store the design data files in the first storage device, sequentially reading respective design data files from the first storage device, applying to design data within each design data file first data processing for conversion to draw data of a predetermined format in such a way that it becomes a pipeline process with the transferring in the pattern writing apparatus, and storing processed draw data in a second storage device in the pattern writing apparatus, sequentially reading respective draw data from the second storage device, sequentially performing second to n-th data processing operations for performing specified data processing tasks with respect to each draw data in such a way that the first to n-th data processing operations become a pipeline processing, and storing each processed data in the second storage device, and reading each data with completion of the second to n-th data processing operations applied thereto to thereby write a specified pattern on a workpiece by using a charged-particle beam controlled based on the each data thus read out.

DETAILED DESCRIPTION OF THE INVENTION

In an illustrative embodiment, an arrangement using an electron beam as one example of the charged particle beam will be explained below. It should be noted that the charged particle beam is not exclusively limited to the electron beam and may alternatively be other beams using charged particles, such as an ion beam. In addition, a charged-particle beam pattern writing apparatus, in particular, variable-shaped electron beam writing apparatus will be explained as one example of the charged-particle beam lithographic apparatus.

Figure 1:
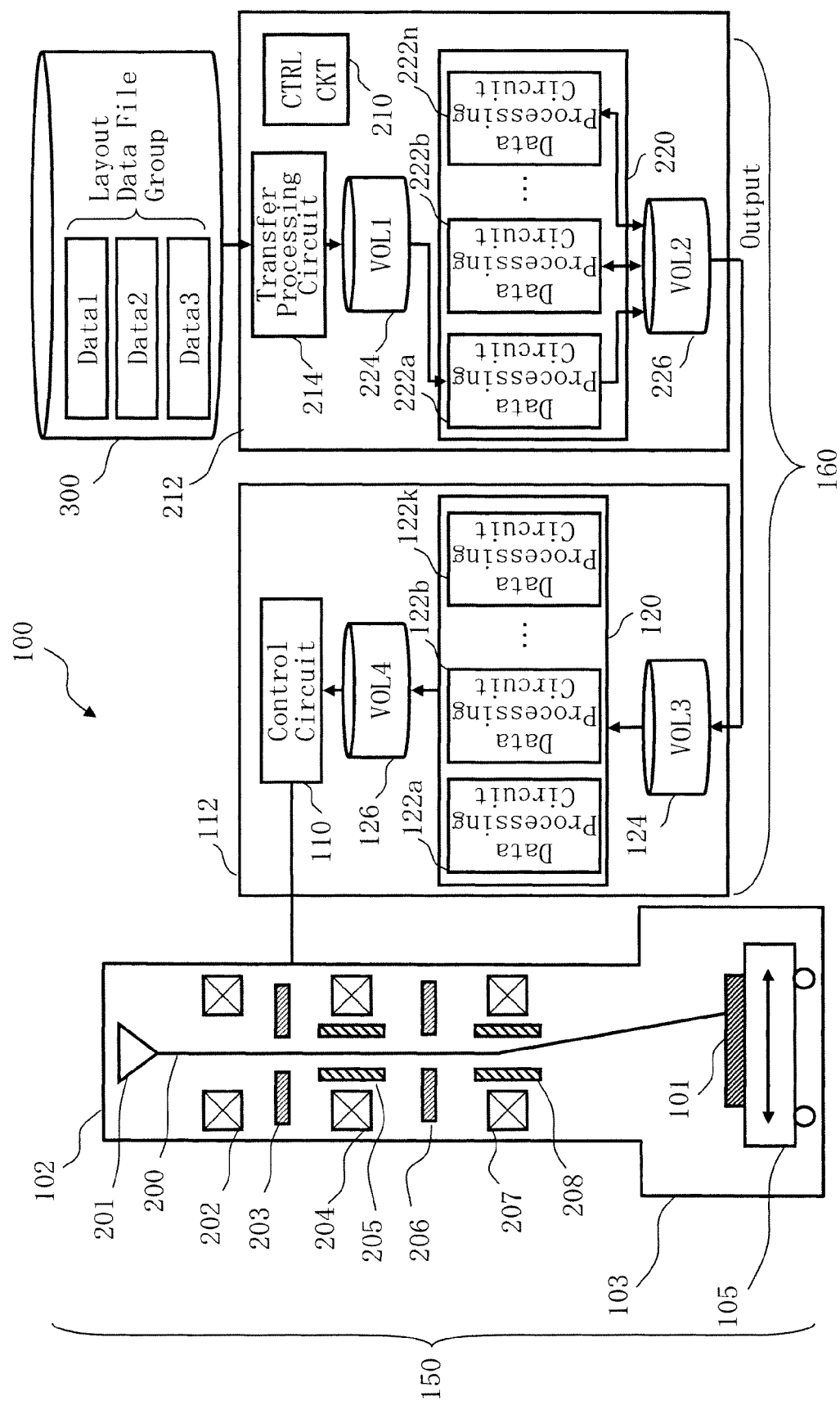
FIG. 1 is a conceptual diagram showing a configuration of a pattern writing apparatus in an embodiment of this invention.

FIG. 1 is a conceptual diagram showing a configuration of a pattern writing apparatus in accordance with one embodiment of this invention.

In FIG. 1, the pattern writing apparatus is designated by reference numeral 100, which includes a writing unit 150 and a control unit 160. The pattern writing apparatus 100 is one example of the electron beam lithographic apparatus. The writing apparatus 100 writes or "draws" an integrated circuit pattern on a workpiece 101. A typical example of the workpiece 101 is a photomask for use in the manufacture of semiconductor devices, such as LSI chips. The writing unit 150 has a writing chamber 103 and an electron lens barrel 102 that is disposed above the writing chamber 103. The electron lens barrel 102 has in its interior space an electron gun 201, illumination lens 202, first aperture 203, projection lens 204, deflector 205, second aperture 206, objective lens 207, and deflector 208. Within the writing chamber 103, an X-Y stage 105 is disposed, on which a workpiece 101 is mounted as a target object with pattern writing applied thereto. The control unit 160 includes a control module 112 and control module 212. The controller 112 is made up of a control circuit 110, a data processing circuit group 120 consisting of a plurality of data processing circuits 122, a storage device 124 such as a hard disk drive (HDD), and a storage device 126 such as HDD. The control circuit 110 and the data processor circuits 122 plus the storage devices 124 and 126 are connected together by a bus (not shown). The control circuit 110 in controller 112 is for management of processing states of the data processing circuit group 120 made up of multiple data processing circuits 122a, 122b, . . . , 122n. The controller 212 is comprised of a control circuit 210, a transfer processing circuit 214, a data processing circuit group 220 consisting of a plurality of data processing circuits 222, a storage device 224 such as a HDD, and a storage device 226 such as HDD. The control circuit 210 and the transfer processor circuit 214 plus the storage devices 224 and 226 are coupled together by a bus (not shown). The control circuit 210 inside of controller 212 is for management of processing states of the data processing circuit group 220, which is made up of multiple data processing circuits 222a, 222b, . . . , 222n. Note here that one example of each processing circuit is a digital computer with a central processor unit (CPU) for execution of a software program(s). Another example is a circuit board or else having an electrical or electronic circuit configuration with functionality covering part or entirety of the processing contents required. Also note that FIG. 1 depicts only those parts or components needed for explanation of this embodiment, although other constituent elements are involved therein on a case-by-case basis.

As previously stated, upon execution of electron beam pattern writing, what is done first is to design the layout of semiconductor integrated circuits, thereby to generate layout data (design data) with a pattern layout defined therein. Usually the layout data is subjected to distributed computation processing and thus is organized so that a one chip region is subdivided into prespecified areas—for example, virtually divided regions each having a stripe- or block-like shape. A single data file, i.e., layout data file, is arranged on a per-region basis. Note here that in the prior art, it is not the pattern writing apparatus 100 but an externally associated device that converts such layout data into draw data with its format inputtable to the electron beam pattern writing apparatus. The resultant draw data are then transferred in unison for input to the electron beam pattern writing apparatus, followed by conversion for pattern writing into data having the format adapted for use within the electron beam pattern writing apparatus after having executed a plurality of stages of conversion processes based on the draw data in the electron beam pattern writing apparatus. On the contrary, the illustrative embodiment is specifically arranged to directly input the layout data being presently stored in a storage device 300 external to the pattern writing apparatus 100 without execution of the conversion of the layout data to draw data in the external device, followed by extensive execution of the data processing to be later executed. A pattern writing method adaptable for use in the illustrative embodiment will be described along its process flow below.

Figure 2:
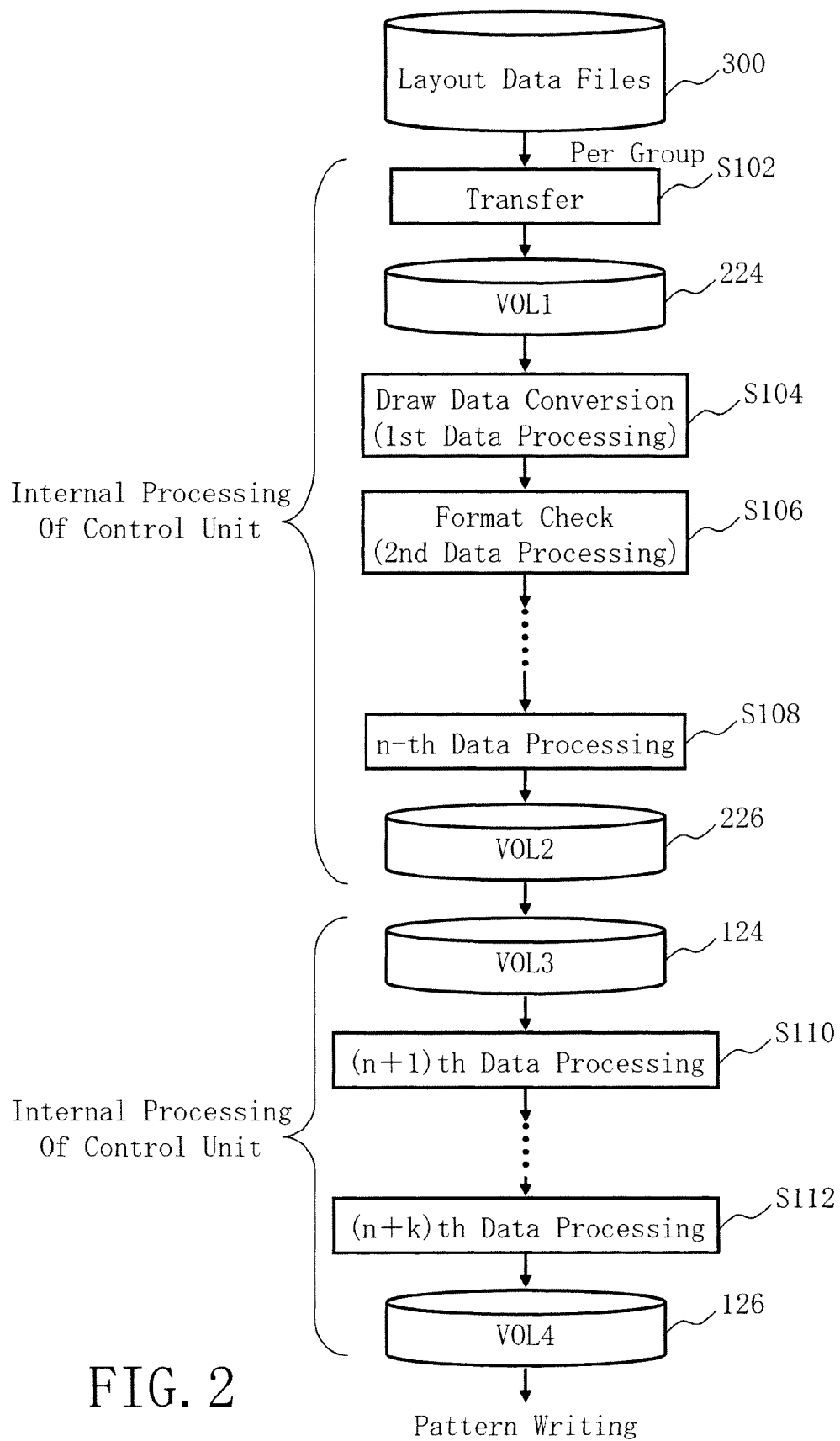
FIG. 2 is a flow chart showing major process steps of an electron beam pattern writing method also embodying the invention.

FIG. 2 is a flowchart showing major process steps of an electron beam pattern writing method in the embodiment.

In FIG. 2, the electron beam (EB) pattern writing method executes, as the processing to be done within the control unit 212, a series of process steps, including a transfer processing step S102 for transferring layout data, a draw data conversion processing step S104, a format verify/check processing step S106, and a miscellaneous n-th data processing step S108, and also sequentially performs as the processing to be done within the control unit 112 a succeeding (n+1)th data processing step S110, a following (n+k)th data processing step S110, and a pattern writing step S126.

At the transfer processing step S102 of FIG. 2, the transfer processing circuit 214 transfers in succession a plurality of layout data files per specified region toward the storage device 224 (first storage device) within the pattern writing apparatus 100, resulting in the data being stored therein.

Here, prior to the transfer of the layout data files, the processing flow of the control circuit 210 in the control unit 212 is first executed.

Figure 3:
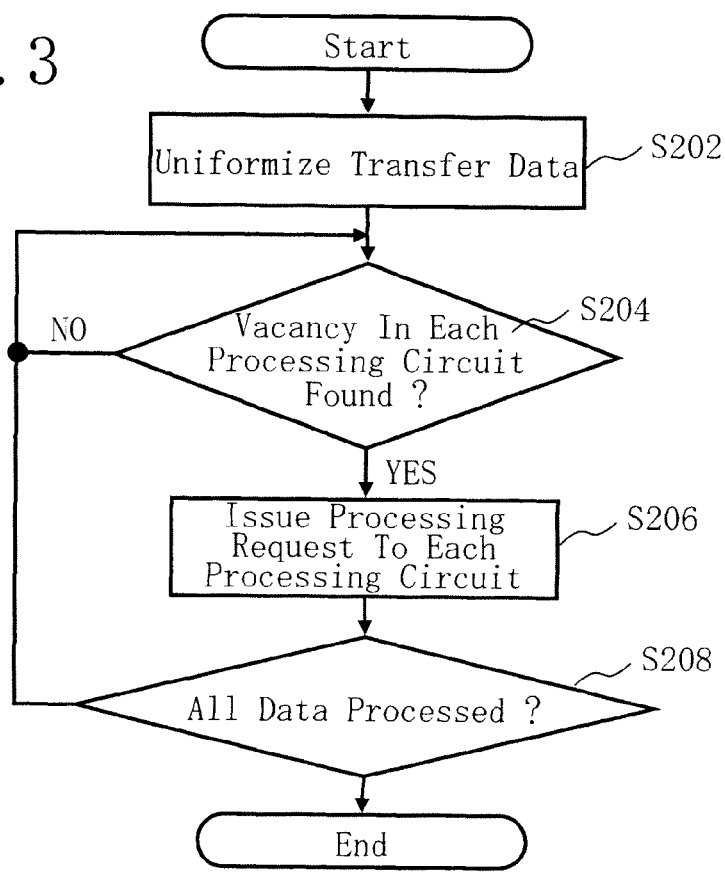
FIG. 3 is a diagram showing an exemplary processing flow of a control circuit in the apparatus shown in FIG. 1.

FIG. 3 is a diagram showing one example of the processing flow of the control circuit in this embodiment.

At step S202 of FIG. 3, a process of uniformizing the data to be transferred is performed by the control circuit 210 in the control unit 212 in a way which follows. When transferring those layout data files to be sent, the control circuit 210 performs grouping of these layout data files so that a one-time transfer data size per pipeline processing to be later described becomes a size suitable for the pipeline processing. In other words, the layout data files are not transferred so that a file is sent at a time for one transfer in a one-by-one way but are arranged in such a way as to perform the grouping by a file group of a predetermined data size including at least one layout data file to thereby ensure that it becomes a size suitable for the pipeline processing. File size information of each layout data file may be input in advance. Then, in the first to n-th data processings to be done after completion of the transmission as will be later described, each data processing is performed on a per-group basis. By performing the grouping in this way, it is possible to uniformize the load of such data processing. This makes it possible to avoid influenceability on pipeline processing to be later described, such as a phenomenon that one has already completed its expected processing whereas the other fails to complete its processing, resulting in traffic delay or "stagnation" of the pipeline processing.

At step S204 of FIG. 3, a process of determining or "judging" a present operation state of each processing circuit is performed in a way which follows. The control circuit 210 first determines prior to layout data file transmission whether a present situation permits issuance of a processing request to each processing circuit in the control unit 212—in other words, it judges whether the processing time has a vacant or "idle" time. If no such idle time is found, then repeat the step S204 until an idle time occurs. If it is found then proceed to step S206.

At step S206 of FIG. 3, a processing request is transferred in a way such that the control circuit 210 sends forth its processing request signal to each processing circuit within the control unit 212.

Figure 4:
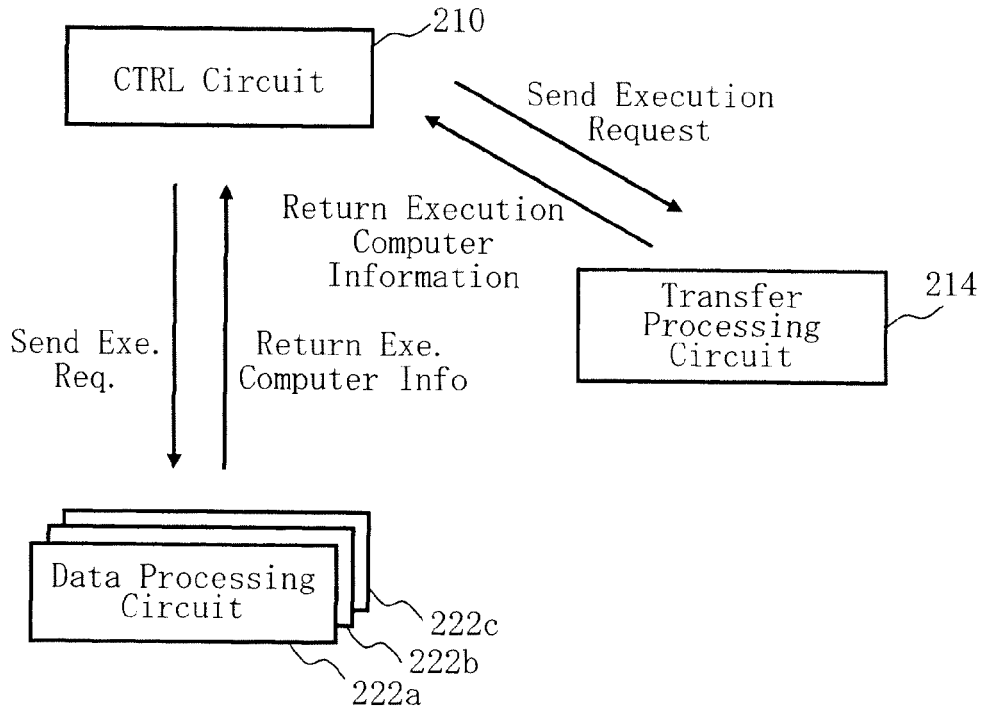
FIG. 4 is a conceptual diagram for explanation of a way of signal transmission and reception among the control circuit and a transfer processing circuit plus a data processing circuit provided in the apparatus.

FIG. 4 is a conceptual diagram for explanation of the way of signal transmission and receipt among the control circuit and transfer processing circuit plus data processing circuit in the embodiment.

As shown in FIG. 4, the control circuit 210 transmits a processing request signal to the transmission processing circuit 214 and each processing circuit 222 in the control unit 212. Then, each processing circuit that received the processing request signal returns execution computer information to the control circuit 210, such as its own load information and processing completion information. By reception of the reply in this way, the control circuit 210 is capable of comprehending the processing information of each processing circuit in the control unit 212. Thus it is possible to manage these respective processing circuits.

At step S208 of FIG. 3 which determines a present processing state, the control circuit 210 judges whether every data processing has completed or not. If not completed yet, then return to step S204. If completed then quit the flow.

Then, in responding to receipt of the above-stated processing request signal, the processing flow is executed by the transfer processing circuit 214 side also.

Figure 5:
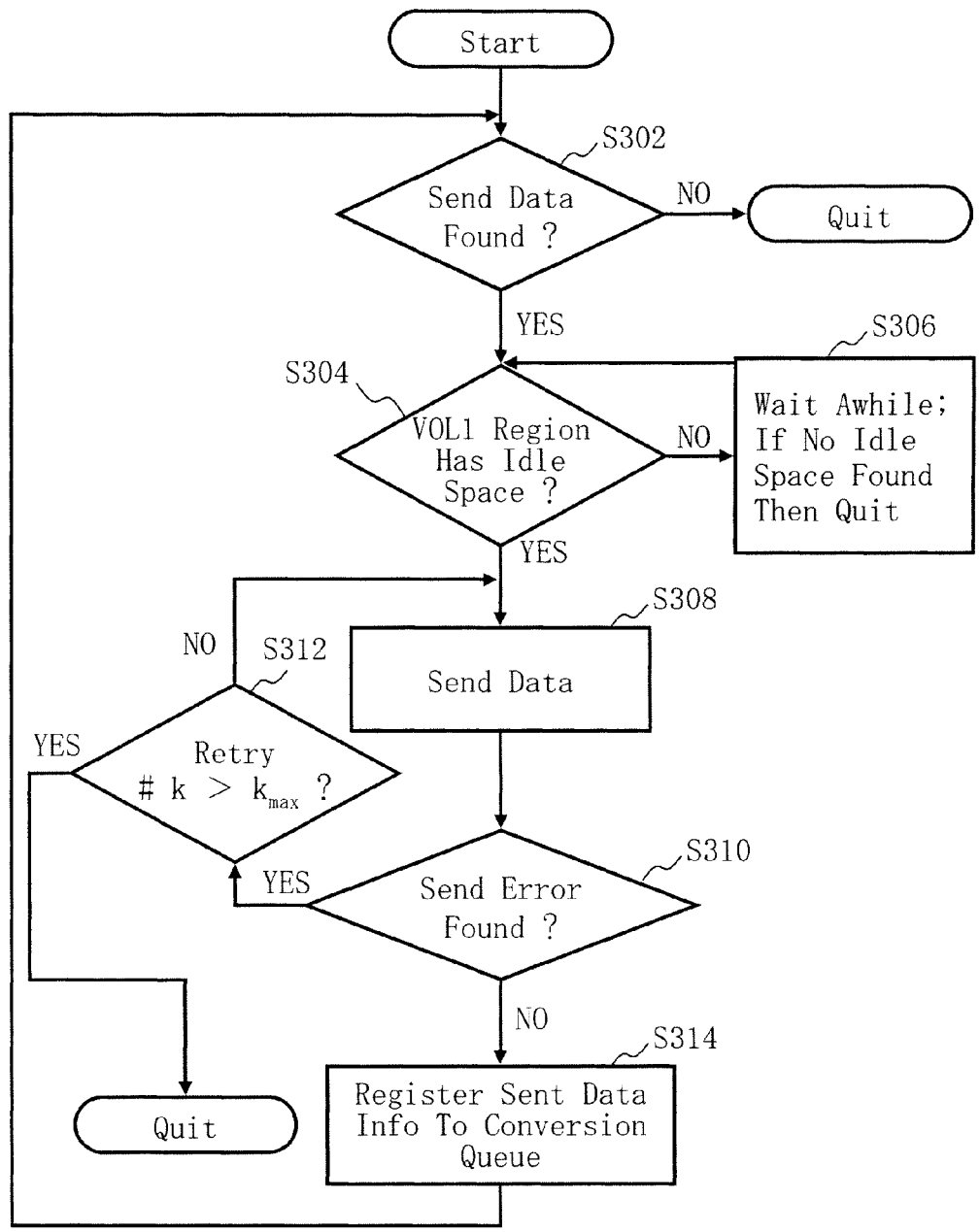
FIG. 5 is a diagram showing one example of a processing flow of the transfer processing circuit.

FIG. 5 is a diagram showing one example of the processing flow of the transfer processing circuit in the embodiment.

At step S302 of FIG. 5 which determines whether transfer data is present or absent, the transfer processing circuit 214 judges whether there is a group of layout data files to be sent to the external storage device 300. If no such group is present, then proceed to step S304. If found then go to step S304.

At step S304 of FIG. 5 which is for storage region judgment, the transfer processing circuit 214 determines whether the storage space of the storage device 224 that becomes a transmission destination has an extra space for accepting the transfer data. If such storage space is found then go to step S308. If this space is absent then proceed to step S306.

At step S306 of FIG. 5, a waiting process is performed in a way which follows. The transfer processing circuit 214 forces the processing flow to go into a wait mode—i.e., halt temporarily—until an extra storage space for accepting the transfer data becomes available in the storage region of the storage device 224 that is a transfer destination. If no such extra storage space is found even after the elapse of a predefined length of wait time, then quit the processing flow.

At step S308 of FIG. 5 for data transfer processing, the transfer processing circuit 214 transfers the grouped layout data files to the storage device 224.

As apparent from the foregoing, the transfer processing circuit 214 operates to sequentially transfer respective layout data files while at the same time controlling the transfer timing of each layout data file so that it falls within the storage capacity of storage device 224. With such the arrangement, it is possible to prevent occurrence of data transfer processing errors. This makes it possible to avoid time loss, such as redoing of the pipeline processing.

At step S310 of FIG. 5, a transfer error decision process is performed in a way which follows. The transfer processing circuit 214 judges whether an error is occurred in the transfer processing. If such error is found, then go to step S312 for retry. If no errors are found then go to step S314.

At step S312 of FIG. 5, a retry number decision process is performed. More specifically, the transfer processing circuit 214 judges a present number of retry events. If the retry number is less than a preset number $k_{max}$ then go to step S308, followed by execution of the data transfer processing. If the number exceeds the preset number $k_{max}$ then quit the processing flow.

At step S314 of FIG. 5 for registration, the transfer processing circuit 214 registers transfer-completed data information to a conversion queue. In this way, the transfer processing of each group of layout data files will be sequentially executed while simultaneously performing the above-stated respective steps of FIG. 5 with respect to each transfer processing.

At step S104 of FIG. 2, a draw data conversion process (first data processing) is performed in a way which follows. The data processing circuit 222a that is one example of the first data processing circuit operates to sequentially read out of the storage device 224 each layout data file. Then, the first data processing for conversion to draw data of a specified format is applied to layout data within each readout layout data file in such a manner as to become pipeline processing with the above-stated transfer processing in the pattern writing apparatus 100, causing the processed draw data to be stored in the storage device 226 (second storage device) in the writing apparatus 100.

Here, on the side of data processing circuit group 220 that received the above-stated processing request signal also, the following processing flow is executed as will be described below.

Figure 6:
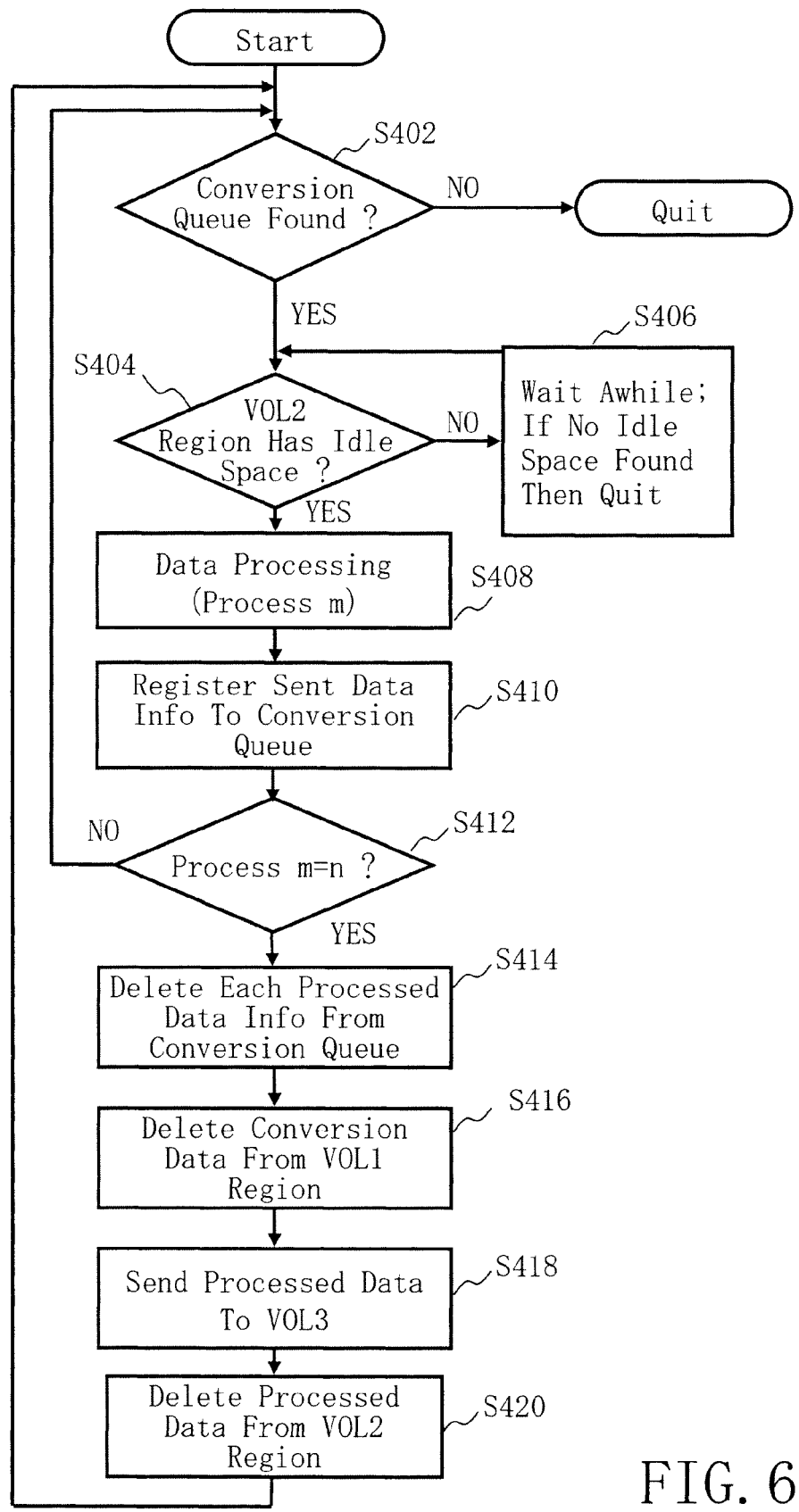
FIG. 6 is a diagram showing one example of a processing flow of the data processing circuit.

FIG. 6 is a diagram showing one example of the process flow of the data processing circuit in the embodiment.

At step S402 of FIG. 6, which is a conversion queue presence/absence decision step, the data processing circuit 222a that performs the first data processing determines whether a conversion queue is present or absent. When any registration of such conversion queue is not found due to receipt of no processing request signal from the control circuit 210, quit the processing flow. If the conversion queue registration is found upon receipt of the processing request signal from the control circuit 210 (i.e., when a conversion queue is present), then proceed to step S404. Although the data processing circuit 222a per se performs the decision here, it is also permissible to provide a separate CPU (not depicted) for management of the data processing circuits 220, for letting it execute the decision processing required. Alternatively, the control circuit 210 that manages the data processing circuits 220 is arrangeable to make such decision.

At step S404 of FIG. 6, a storage region judgment process is performed in a way which follows. The data processing circuit 222a that is expected to execute the first data processing, for example, determines whether an idle space with its capacity large enough to accept the processed data is present in the storage region of the storage device 226 that becomes a storage destination after the processing. If such vacancy is found, then proceed to step S408; otherwise, go to step S406.

At step S406 of FIG. 6, wait processing is performed in a way which follows. The data processing circuit 222a that executes the first data processing, for example, forces the processing flow to stay in standby until an idle space that is large enough to accept the processed data becomes available in the storage region of the storage device 226 that becomes a transfer destination. If no such extra storage space is found even after the elapse of a predefined length of wait time, then quit the processing flow.

At step S408 of FIG. 6 which is a data processing process, the data processing circuit 222a that executes the first data processing, for example, sequentially reads respective layout data files out of the storage device 224. Then, for the layout data within each layout data file thus read out, perform conversion into draw data of the format used for the pattern writing apparatus 100.

Usually the design data are not created so that all of them have the same format. In view of this, the prior art was such that the design data are converted by an external device into draw data with a specific format that is inputtable to EB pattern writing apparatus. In contrast, the illustrative embodiment is such that the data processing circuit 222a converts the layout data of a layout data file which is produced to have any one of a plurality of formats into the above-stated draw data of the specific format, thereby enabling achievement of supportability and handleability even for those layout data as created to have different formats. Thus it is possible to avoid the need to match or "tune" these formats together by extra use of a separately provided device external to the EB lithographic tool.

Figure 7:
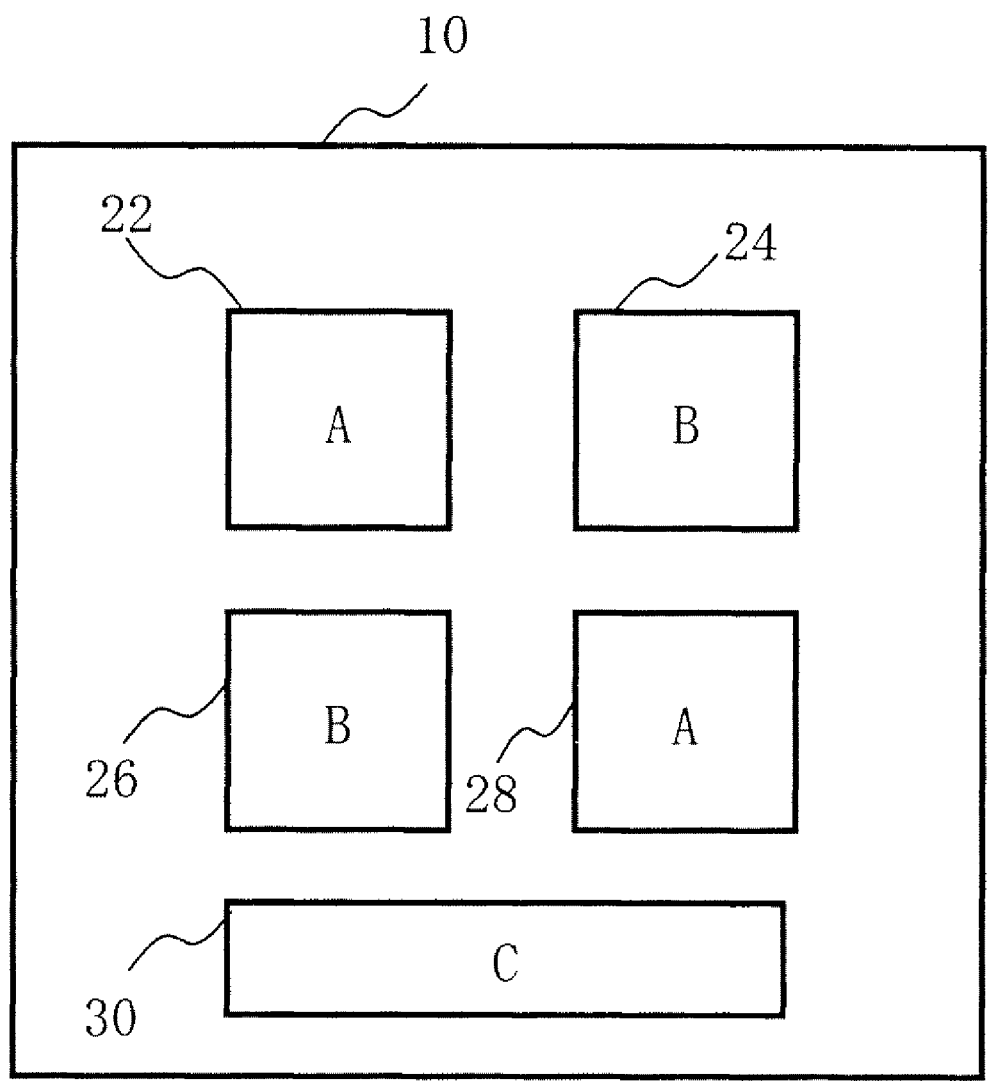
FIG. 7 is a diagram showing one example of a mask layout in the embodiment.

FIG. 7 is a diagram showing one example of a mask layout in the embodiment.

As shown in FIG. 7, a one mask for use as the workpiece 101 is subjected to pattern writing so that a plurality of chip patterns are drawn on its top surface. Respective chip data sets of these chip patterns are sometimes created in some different formats. In the example shown in FIG. 7, chip data sets 22 and 28 are created in a format "A"; chip data sets 24 and 26 are formed in a format "B"; and, a chip data set 30 is in a format "C," by way of example. While in the prior art the pattern writing apparatus side is merely capable of inputting only a restricted kind of draw data as created by conversion of these different-format layout data to have a single specific format unique to the writing apparatus, this embodiment is able to input even "raw" layout data which are prepared in a plurality of different formats.

The data processing circuit 222a that is expected to execute the first data processing, as an example, performs as the first data processing the conversion of layout data of a layout data file created in any one of a plurality of formats into draw data having a specified format adaptable for use in the EB pattern writing apparatus 100. To do this, a conversion software program is preinstalled for converting the layout data created in each format of the plurality of formats into draw data having the format for use in the pattern writing apparatus 100. Then, identify which one of the formats by use of an identifier indicating the format of input layout data to thereby perform conversion in a way best fit to the format identified. More than two conversion software programs may be installed and stored in any one of the storage device 224 and storage device 226 or in a separate storage device (not shown).

Figure 8:
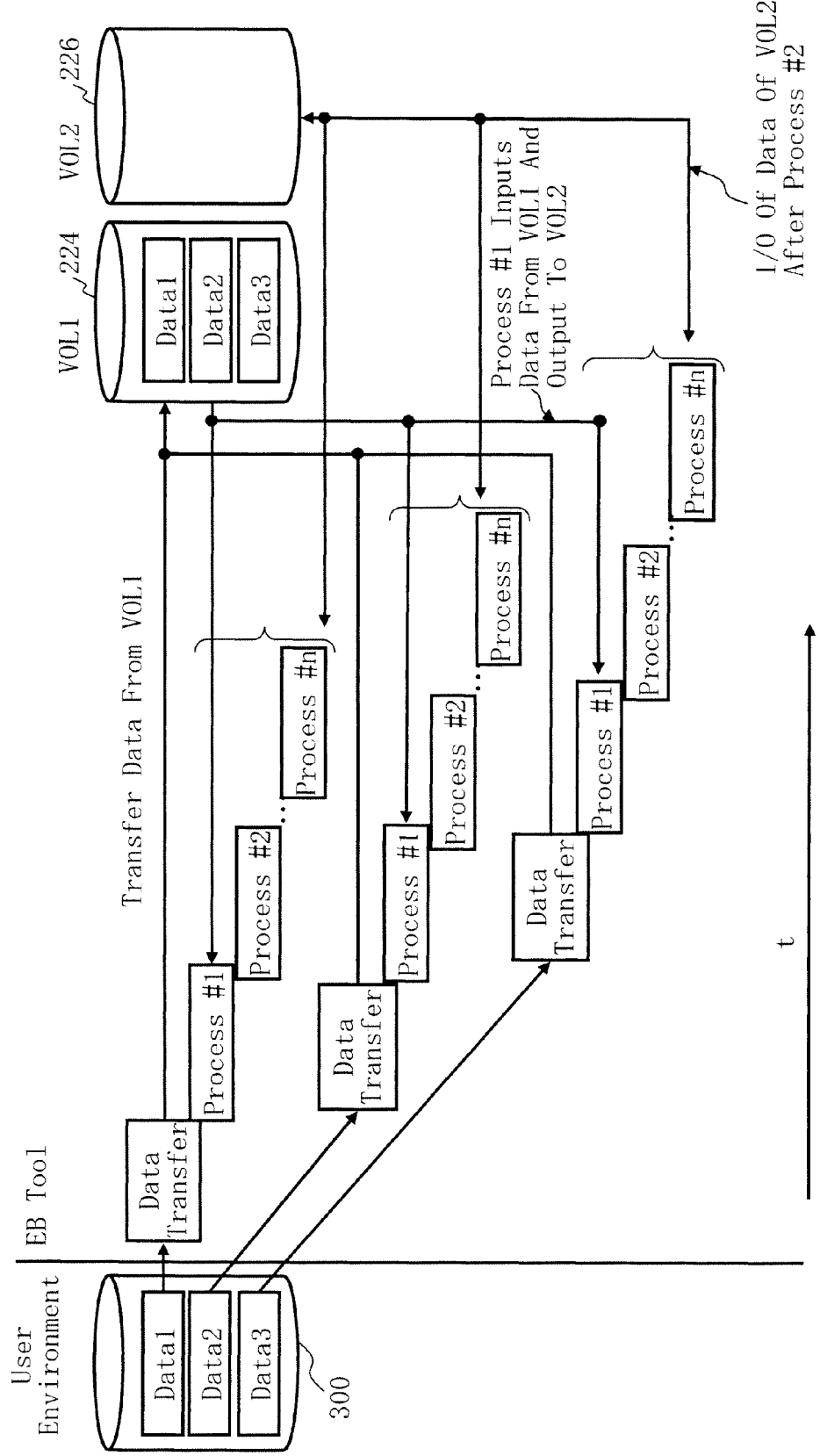
FIG. 8 is a flow diagram for explanation of pipeline processing in the embodiment.

FIG. 8 is a flow diagram for explanation of the pipeline processing in the illustrative embodiment.

In this embodiment, those processes covering from the above-stated transfer processing to the n-th data processing to be later described are applied to each group of layout data in a pipeline processing way. In FIG. 8, a processed data group of layout data that become data No. 1 and a processed data group of layout data that become data #2 and also a processed data group of layout data that become data #3 are handled in a way such that an ensemble of from transfer processing (data transmission) through the first data processing (process #1 for draw data conversion) and second data processing (process #2) et seq. up to the n-th data processing (process #n) are arranged in a pipeline way. Carrying forward the pipeline processing in this way permits a transfer time and a time required for the draw data conversion processing which becomes the first data processing plus a time taken for its following data processing to overlap together, thereby making it possible to significantly shorten a total length of time when compared to a prior known scheme for simply adding together a transfer time and a time needed for draw data conversion processing that becomes the first data processing and also a time required for its following data processing. Then, the draw data after completion of the first data processing (process #1) are stored in the storage device 226 (second storage device) in the pattern writing apparatus 100.

Upon execution of the pipeline processing in the way stated above, even when the data transfer failed during the transfer processing, it is possible by execution of a process of continuing to retry at steps S310 and S312 to avoid the risk of having to redo the pipeline processing, as described previously. Further, in the case of waiting for vacancy of the region of the storage device 224 at step S304 during transfer processing, when the storage region needed is in shortage, the processing is forced to temporarily halt until a space becomes available and then the processing gets restarted at a time point that such space is found whereby it is also possible to prevent the risk of having to redo the pipeline processing. Similarly, in the case of waiting for vacancy of the region of the storage device 226 at step S404, when the storage region is less than expected, the processing is forced to temporarily halt until enough space becomes available and then the processing is restarted at an instant that such space is available, thereby making it possible to avoid the risk of having to redo the pipeline processing At step S410 of FIG. 6, a registration process is performed. More specifically, the data processing circuit 222a registers the data processing-completed data information to the conversion queue.

At step S412 of FIG. 6, a decision process is performed in a way which follows. When the task of interest is not the data processing to be executed by the last stage of data processing circuit 222n, that is, if data processing-completed process m (m≦n) is not the n-th process n, then return to step S402. If the data processing by the data processing circuit 222n is completed then go to step S414.

Returning to step S402 of FIG. 6, a conversion queue presence/absence decision process is performed in the way that follows. At this time, the data processing circuit 222b that is expected to execute the second data processing determines whether a conversion queue is present or absent. Although here the data processing circuit 222b per se performs the decision, it is permissible to provide a separate CPU (not shown) or else for management of the data processing circuits 220, for letting it execute the decision processing. Alternatively, the control circuit 210 that manages the data processing circuits 220 may be arranged to make such decision. Then, at step S404 of FIG. 6, a storage region judgment process is performed. At this step, the data processing circuit 222b that is expected to execute the second data processing, for example, determines whether there is an idle space large enough to accept the processed data in the storage region of the storage device 226 that becomes a storage destination after processing. If such vacant space is found then proceed to step S408. If no such space is found then go to step S406. Next at step S406 of FIG. 6, a waiting process is done in a way such that the data processing circuit 222b that executes the second data processing, as an example, forces the processing flow to temporarily go into standby until an idle space large enough to accept the processed data becomes available in the storage region of the storage device 226 that becomes a transfer destination. If no such extra storage space is found even after the elapse of a predefined wait time then quit the processing flow.

At step S106 of FIG. 2 (this is also the second-time execution of step S408 of FIG. 6), format check processing (second data processing) is carried out in a way which follows. The data processing circuit 222b that is one example of the second data processing circuit sequentially reads each draw data from the storage device 226 and then applies to each draw data the second data processing for performing format checking. Then, let the processed data be stored by overwrite in the storage device 226.

At step S410 of FIG. 6, a registration process is performed. The data processing circuit 222b registers the data processing-completed data information to the conversion queue. Then at step S412 of FIG. 6, determine whether the data processing by means of the data processing circuit 222n is completed or not. If this processing is not completed yet, then execute a set of processes at steps S402 to S406 for the third time.

Then, at step S108 of FIG. 2 (this is also the n-th execution of step S408 of FIG. 6), n-th data processing is performed in a way which follows. The data processing circuit 222n which is one example of the n-th data processing circuit at a post-stage of the data processing circuit 222c that is one example of the third data processing circuit sequentially reads each draw data out of the storage device 226 and performs pre-specified n-th data processing for each draw data. Then, let the processed data be stored in the storage device 226. For example, shot number estimation is performed as the third data processing. Then at step S410 of FIG. 6 for registration, the data processing circuit 222b registers the data processing-completed data information to the conversion queue. Next, at step S412 of FIG. 6, determine whether the data processing by the data processing circuit 222n is completed or not.

In the way stated above, a process flow spanning from step S402 to step S412 will be repeated until completion of the data processing by the last-stage data processing circuit 222n. Each of the steps S402 to S410 is executed by a data processing circuit 222m which is expected to perform its corresponding m-th (m≦n) data processing. Upon completion of the data processing by the data processing circuit 222n at step S412 of FIG. 6, proceed to step S414 of FIG. 6.

At step S414 of FIG. 6, a conversion queue deletion process is performed in a way which follows. Each data processing circuit 222 deletes the information of each data conversion-completed data with the processing up to the n-th session having been ended. Although each data processing circuit 222 performs such deletion here, the last-stage data processing circuit 222n that executes the n-th data processing may be arranged to do the deletion as a representative of the circuits 222 involved. Alternatively, it is permissible to provide a separate CPU (not shown) or the like for management of the data processing circuits 220 and let it execute the deletion processing. Still alternatively, the control circuit 210 that manages the data processing circuits 220 is designable to do such deletion.

At step S416 of FIG. 6, a process for deletion of the processed data of VOL1 is performed. The data processing circuit 222n erases from the storage device 224 the group of layout data, for which the processing up to the n-th processing has been completed. By sequentially erasing the data with completion of the processing up to the n-th session, a vacant or "blank" storage region becomes available in the storage device 224, thereby permitting sequential storage of transfer data at a later stage(s). Although the data processing circuit 222n performs the data erase, another data processing circuit 222 may perform that task as a representative of the data processing circuits 222. Alternatively, it is permissible to provide a separate CPU (not shown) for management of the data processing circuits 220 and let it execute the deletion processing. Still alternatively, the control circuit 210 that manages the data processing circuits 220 is designable to do the data deletion.

At step S418 of FIG. 6, a process of transferring the processing-completed data is performed. To do this, the data processing circuit 222n transfers the group of layout data with the processing up to the n-th one having been 124 of control unit 112. Although the data processing circuit 222n performs this data transfer processing here, another data processing circuit 222 may perform the transfer processing as a representative of the processing circuits 222. Alternatively, it is permissible to provide a separate CPU (not shown) for management of the data processing circuits 220 and let it execute the transfer processing. Still alternatively, the control circuit 210 that manages the data processing circuits 220 is designable to perform the transfer processing. Alternatively, any one of the data processing circuits 122 of the control unit 112 may execute the transfer processing. Alternatively, it is a good idea to provide a separate CPU (not shown) for management of the data processing circuits 120 of control unit 112 and let it execute the transfer processing. Still alternatively, the control circuit 110 that manages the data processing circuits 120 of controller 112 may perform the transfer processing.

At step S420 of FIG. 6, which is a process of deleting the to-be-processed data of VOL2, the data processing circuit 222n erases from the storage device 226 the group of layout data, for which the processing up to the n-th session has been completed. By sequentially erasing the data with completion of the processing up to the n-th processing, a blank storage region becomes available in the storage device 226, thereby enabling sequential storage of the data of each group to be processed at a later stage(s). Although the data processing circuit 222n performs such data deletion here, another data processing circuit 222 may perform the deletion as a representative of the data processing circuits 222. Alternatively, it is permissible to provide a separate CPU (not shown) for management of the data processing circuits 220 and let it execute the deletion processing. Still alternatively, the control circuit 210 that manages the data processing circuits 220 may perform such data erase.

Although in FIG. 6 the system routine is arranged to return to step S402 and repeat its following steps after having proceeded to step S420 from step S402, it is not such that after one group has completed the routine of from step S402 to S420, processing for the next group is performed; rather, the respective steps stated above are executed for each layout data group in a way pipelined therewith.

Then, the remaining necessary data processing is executed until execution of the next pattern writing at the control unit 112.

At step S110 of FIG. 2, which is a process of performing the (n+1)th data processing, the data processing circuit 122a that is one example of the (n+1)th data processing circuit sequentially reads out of the storage device 124 each draw data as processed by the control unit 212 and apply to each draw data the (n+1)th data processing of prespecified data processing. Then, let the processed data be stored in the storage device 126.

Then, processes of from the (n+1)th to (n+k)th data processing operations are sequentially performed to thereby create the final data used for pattern writing, e.g., shot data.

More specifically, at step S112 of FIG. 2, the (n+k)th data processing is performed in a way which follows. The data processing circuit 122k that is one example of the (n+k)th data processing circuit sequentially reads each draw data from the storage device 126 and then performs for each draw data the (n+k)th data processing of prespecified data processing. Then, let the processed data be stored in the storage device 126.

In the way stated above, each data with completion of the n-th data processing is read out of the storage device 226, based on which data further data processing is performed at the control unit 112. Then, the pattern writing unit 150 uses the electron beam 200 that is controlled by the format data at the last stage in the pattern writing apparatus to write a specified pattern on the workpiece 101 in a way as will be described below.

The electron beam 200 emitted from the electron gun 201, which beam is one example of the charged particle beam, illuminates with the aid of the illumination lens 202 an entirety of the first aperture 203 having a rectangular opening or hole, for example. Here, the electron beam 200 is first shaped to have a rectangular shape as an example. The electron beam 200 of a first aperture image which passed through the first aperture 203 is then projected by the projection lens 204 onto the second aperture 206. A position of the first aperture image on such second aperture 206 is controlled by the deflector 205 to enable the beam to vary in shape and size. The electron beam 200 of a second aperture image that has passed through the second aperture 206 is subjected to focusing by the objective lens 207 and is then deflected by the deflector 208 to fall onto the workpiece 101 on XY stage 105 at a desired position on the workpiece.

Figure 9A:
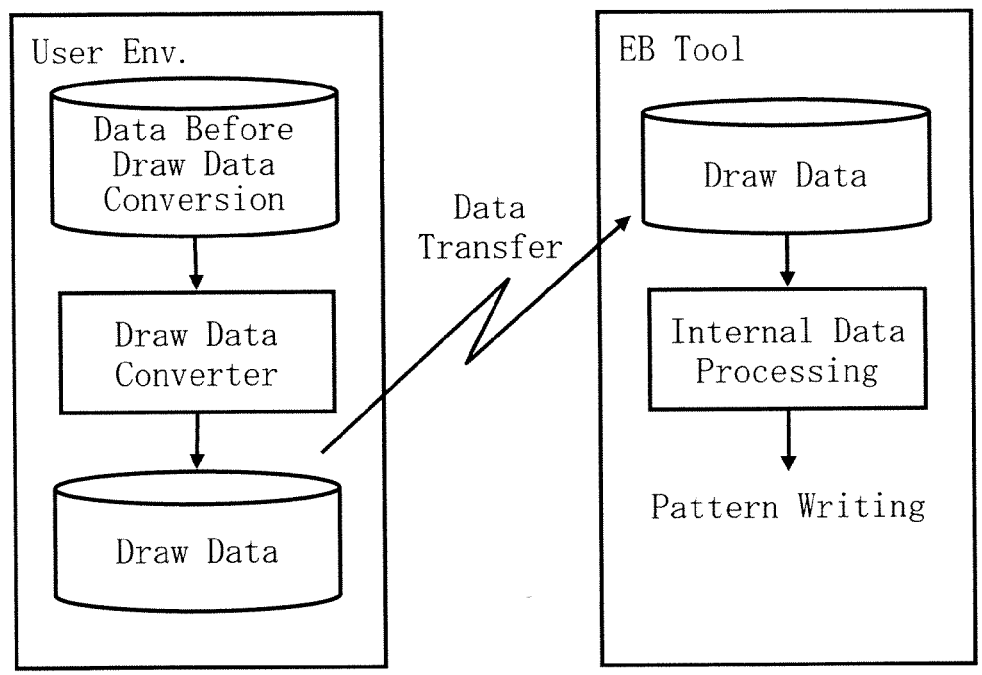
FIGS. 9A and 9B are conceptual diagrams for comparison of the embodiment to a prior known arrangement.
Figure 9B:
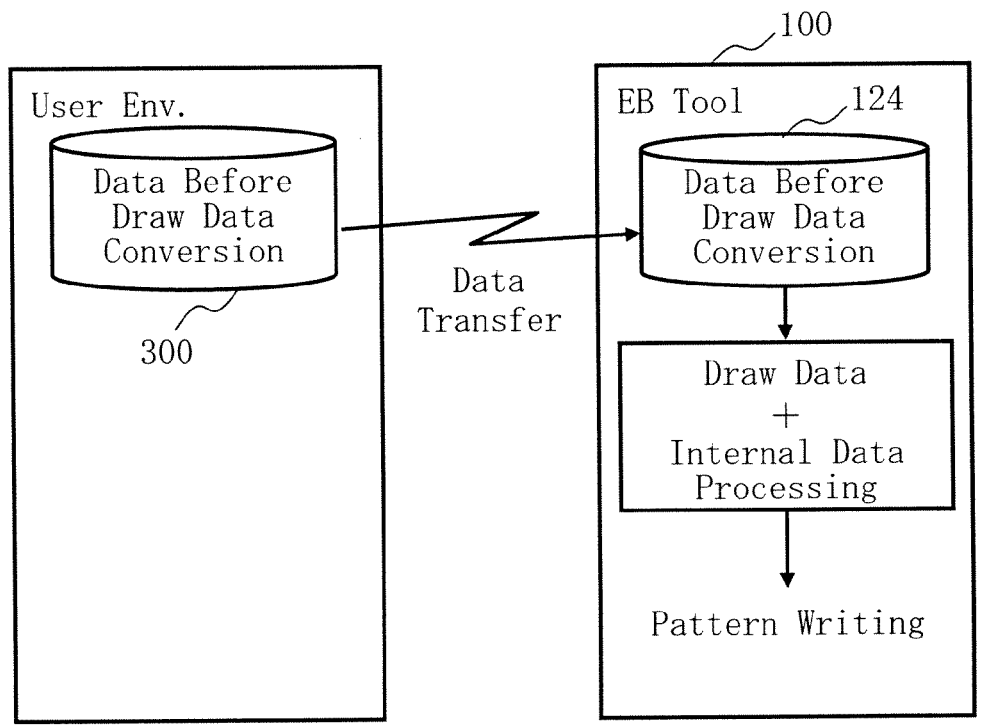
Figure 10:
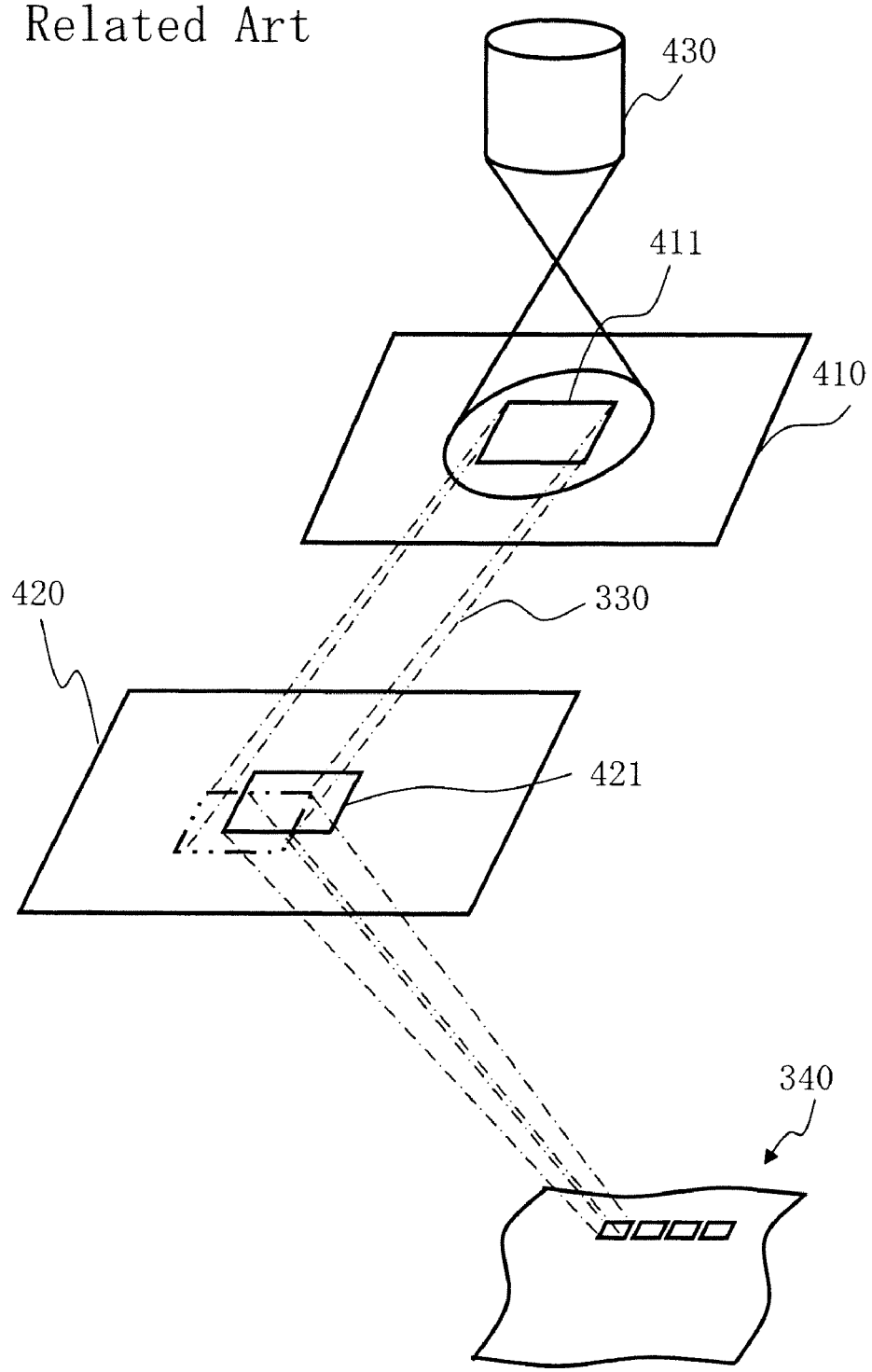
FIG. 10 is a conceptual diagram for explanation of an operation of one prior known variable-shaped electron-beam pattern writing apparatus.

FIGS. 9A and 9B are conceptual diagrams for comparison of the embodiment to a prior known arrangement.

As shown in FIG. 9A, in the prior art, the draw data conversion processing was performed by an external computer owned by a user or else, which is different from the pattern writing apparatus. Finally produced draw data are transferred in unison to the writing apparatus in all at once. Obviously, this results in a total time in the prior art being unacceptably lengthened. This can be said because the total time required is a mere addition of respective separate processing time periods—i.e., a conversion time that is taken for the external device to entirely convert to draw data a plurality of layout data files per prespecified region with a pattern layout defined therein, a transfer time required for transferring in unison the resulting group of draw data to the writing apparatus in an all-at-a-time fashion, and a data processing time taken for processing the draw data as input to the writing apparatus. In contrast, as shown in FIG. 9B, the illustrative embodiment is arranged so that the processing for conversion to draw data is performed within the pattern writing apparatus 100, thereby making it possible to eliminate the need for execution of the draw data conversion processing that was done by the external computer which is different from the pattern writing apparatus and which is owned by the user or else. In addition, as the first data processing and its associated transfer processing become pipeline processing (pipeline arrangement), it is possible to sequentially push ahead the processing for conversion of layout data into draw data within a time period for data transferring. Furthermore, its following each draw data processing also becomes pipeline processing (pipeline arrangement) with the first data processing, thus enabling execution of its following processing of the draw data during data transferring. Thus it is possible to overlap together the transfer time and the conversion time plus the data processing time, thereby enabling noticeable reduction of the total length of time required. This permits achievement of efficiency-excellent data processing, resulting in a significant decrease in pattern writing time. Further, by enabling input of layout data having a plurality of different formats, it is possible to input the layout data of a mask with layout of several chips that are formed in multiple formats.

So far, the illustrative embodiment has been explained while referring to practical examples thereof. However, the present invention should not exclusively be limited thereto.

In addition, although certain explanations are eliminated as to those parts that are not directly related to the explanation of this invention, such as apparatus/device arrangements, control schemes and others, any required apparatus arrangements and control techniques are employable through appropriate selection for practical implementation. For example, while those explanations are omitted concerning a configuration of the control unit for controlling the variable-shaped EB pattern writing apparatus 100, it is needless to say that any required control unit configuration is usable in an appropriately selected way.

Additionally, all possible charged-particle beam pattern writing apparatuses, charged-particle beam pattern writing methods, charged-particle beam pattern draw data making methods, charged-particle beam draw data conversion methods and apparatuses for use therewith, which comprise the subject matter of this invention and are design-alterable by a skilled person on a case-by-case basis, are included in the scope and coverage of this invention.

Additional advantages and modification will readily occur to those skilled in the art. The invention in its broader aspects is not limited to the specific details and representative embodiments shown and described herein. Various modifications may be made without departing from the spirit or scope of the general inventive concept as defined by the appended claims and equivalents thereof.

What is claimed is:

1. A charged particle beam writing apparatus comprising:
   first and second storage devices;
   a transfer processing unit operative to sequentially transfer to the first storage device a plurality of design data files per prespecified region having a pattern layout defined therein;
   a first data processor unit operative to sequentially read respective design data files from said first storage device and perform, in a pipeline processing way with the transfer processing, first data processing for converting design data within each data file into draw data of a predetermined format and then store the draw data processed in the second storage device, said first data processor unit performing said first data processing for converting design data within a design data file of the plurality of design data files into draw data of the predetermined format while said transfer processing unit performing said transfer processing for a next design data file of the plurality of design data files in said pipeline processing way;
   a set of second to n-th data processor units operative to sequentially read respective data files from said second storage device and perform mutually different ones of second to n-th data processing operations against each draw data in a way that the first to n-th data processing operations become a pipeline processing and then store the draw data processed in said second storage device; and
   a pattern writing unit operative to write a specified pattern on a workpiece by use of a charged particle beam which is controlled based on each data with the n-th data processing applied thereto, said each data being stored in said second storage device.

2. The apparatus according to claim 1, wherein said transfer processing unit transfers the design data file as created to have any one of a plurality of formats, and wherein said first data processor unit performs as the first data processing conversion of the design data of said design data file prepared to have any one of said plurality of formats into said draw data of the predetermined format.

3. The apparatus according to claim 2, wherein said second data processor unit performs format checking.

4. The apparatus according to claim 1, wherein said plurality of design data files are grouped by a file group of a certain data size including at least one design data file, wherein said transfer processing unit transfers said design data files on a per-group basis, and wherein each of the first to n-th data processing units performs its corresponding data processing on a per-group basis.

5. The apparatus according to claim 1, wherein said first storage device erases a design data file of said plurality of design data files stored therein with the n-th data processing being completed, and wherein said transfer processing unit sequentially transfers respective design data files of said plurality of design data files while simultaneously controlling transfer timing of design data file to ensure accommodation within a storage capacity of said first storage device.

6. The apparatus according to claim 5, wherein said transfer processing unit again transfers when its transfer processing has failed.

7. The apparatus according to claim 5, wherein when a blank space corresponding to a transfer data amount is not available in the storage capacity of said first storage device, said transfer processing unit pauses a processing flow until the blank space corresponding to the transfer data amount becomes available.

8. The apparatus according to claim 1, wherein when a blank space permitting acceptance of said draw data is not available in a storage capacity of said second storage device, said first data processing unit pauses a processing flow until the blank space corresponding to the processed draw data becomes available.

9. The apparatus according to claim 8, wherein said second storage device sequentially outputs each data with completion of the n-th data processing and erases the data outputted.

10. A charged particle beam pattern writing method comprising:
    sequentially transferring a plurality of design data files of each prespecified region having a pattern layout defined therein to a first storage device in a pattern writing apparatus to thereby store the design data files in the first storage device;
    sequentially reading respective design data files from said first storage device, applying to design data within each design data file first data processing for conversion to draw data of a predetermined format in such a way that it becomes a pipeline process with said transferring in said pattern writing apparatus, and storing processed draw data in a second storage device in said pattern writing apparatus, said first data processing for converting design data within a design data file of the plurality of design data files into draw data of the predetermined format is performed while said transfer processing for a next design data file of the plurality of design data files is performed in said pipeline processing way;
    sequentially reading respective draw data from said second storage device, sequentially performing second to n-th data processing operations for performing specified data processing tasks with respect to each draw data in such a way that the first to n-th data processing operations become a pipeline processing, and storing each processed data in said second storage device; and
    reading each data with completion of said second to n-th data processing operations applied thereto to thereby write a specified pattern on a workpiece by using a charged-particle beam controlled based on said each data thus read out.

* * * * *